(12) United States Patent  
Khalid

(10) Patent No.: US 6,747,892 B2
(45) Date of Patent: Jun. 8, 2004

(54) SENSE AMPLIFIER FOR MULTILEVEL NON-VOLATILE INTEGRATED MEMORY DEVICES

(75) Inventor: Shahzad Khalid, Union City, CA (US)

(73) Assignee: SanDisk Corporation, Sunnyvale, CA (US)

(*) Notice: Subject to any disclaimer, the term of this patent is extended or adjusted under 35 U.S.C. 154(b) by 0 days.

(21) Appl. No.: 09/989,996

(22) Filed: Nov. 20, 2001

(65) Prior Publication Data

US 2003/0095431 A1 May 22, 2003

(30) Foreign Application Priority Data

Nov. 21, 2000 (JP) ........................................ 2000-353811
Oct. 16, 2001 (JP) ........................................ 2001-318180

(51) Int. Cl.[7] ............................................. G11C 16/04
(52) U.S. Cl. ............................. 365/185.03; 365/185.21; 365/185.25; 365/185.01
(58) Field of Search ................... 365/185.03, 185.01, 365/185.21, 185.25, 185.22, 185.24

(56) References Cited

U.S. PATENT DOCUMENTS

| 5,172,338 A | 12/1992 | Mehrotra et al. |
| 5,220,531 A | 6/1993 | Blyth et al. |
| 5,637,329 A | 6/1997 | Abrams et al. |
| 5,838,612 A | 11/1998 | Calligaro et al. |
| 5,859,794 A | 1/1999 | Chan |
| 6,222,762 B1 | 4/2001 | Guterman et al. |
| 6,317,364 B1 * | 11/2001 | Guterman et al. ...... 365/185.28 |
| 6,320,808 B1 * | 11/2001 | Conte et al. .................. 365/205 |
| 6,490,200 B2 | 12/2002 | Cernea et al. |
| 6,504,762 B1 * | 1/2003 | Harari .................... 365/185.24 |
| 6,538,922 B1 | 3/2003 | Khalid et al. |
| 6,570,790 B1 | 5/2003 | Harari |

* cited by examiner

Primary Examiner—Connie C. Yoha
(74) Attorney, Agent, or Firm—Parsons Hsue & de Runtz LLP

(57) ABSTRACT

A sense amplifier (100) useable with memories having multi-level memory cells (105) includes a cascode device (135) coupled to the cell (105) to increase sense amplifier resolution. In a pre-charge mode, the sense amplifier (100) is configured to pre-charge a bit-line (140) of the cell (105) to reduce time required to read the cell. The pre-charge mode may include a unity gain buffer (175) to which a reference voltage is applied, and a switch (165, 170). The switch (165, 170) couples the buffer to the cascode device (135) to pre-charge the bit-line (140), and decouples the buffer from the device to enable the amplifier (100) to develop a voltage signal representing data stored in the cell. The sense amplifier (100) can be re-configured in a regeneration mode to amplify the voltage signal, to conserve chip space, and reduce cost and errors in reads.

19 Claims, 8 Drawing Sheets

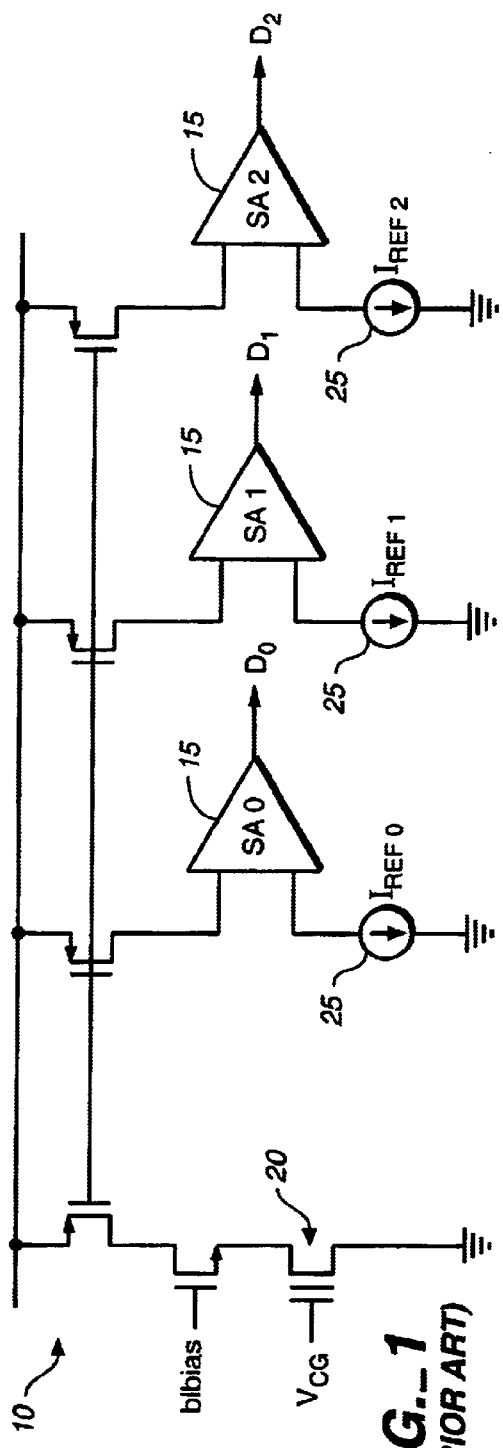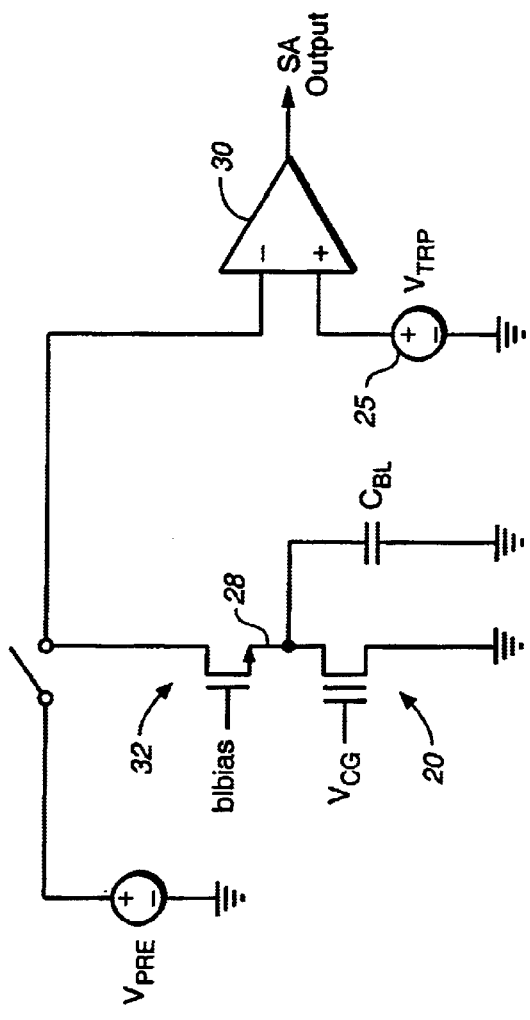
FIG._1 (PRIOR ART)
FIG._2 (PRIOR ART)

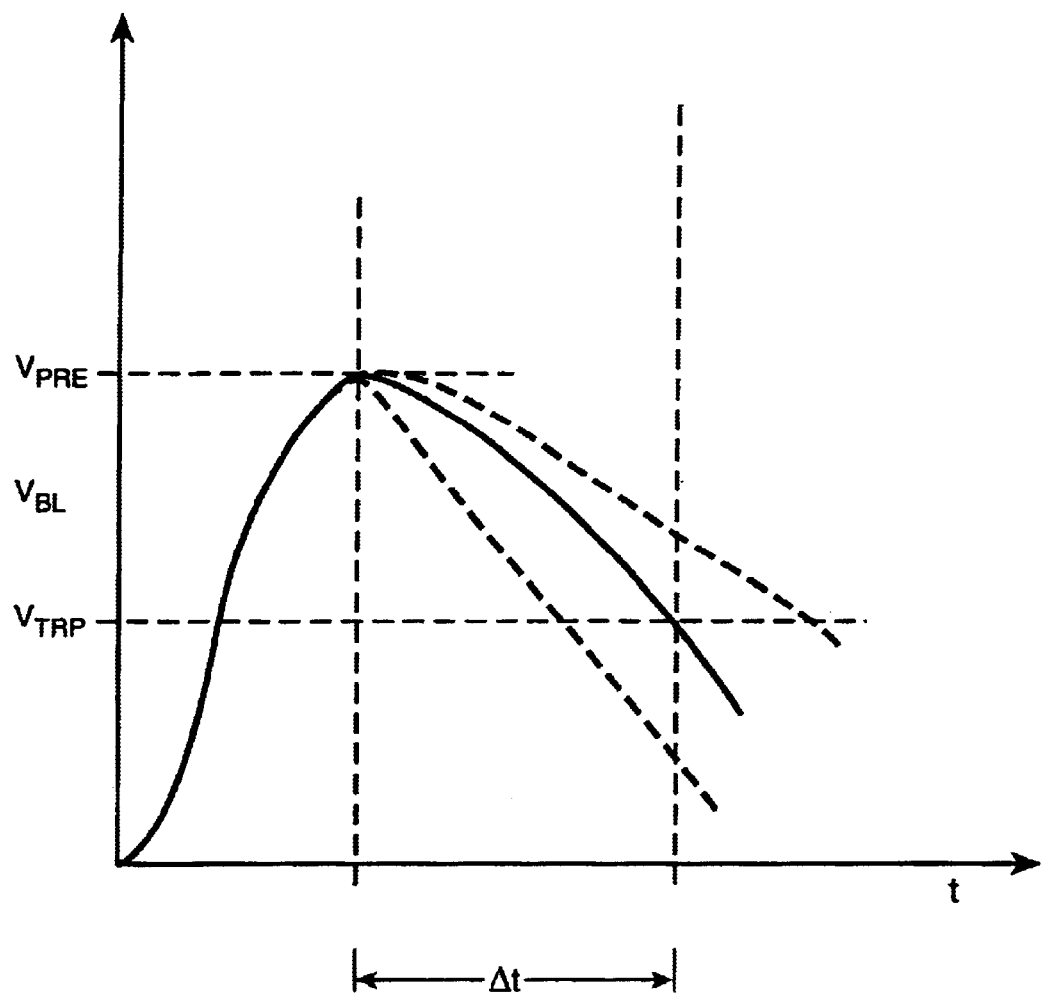
FIG._3
(PRIOR ART)

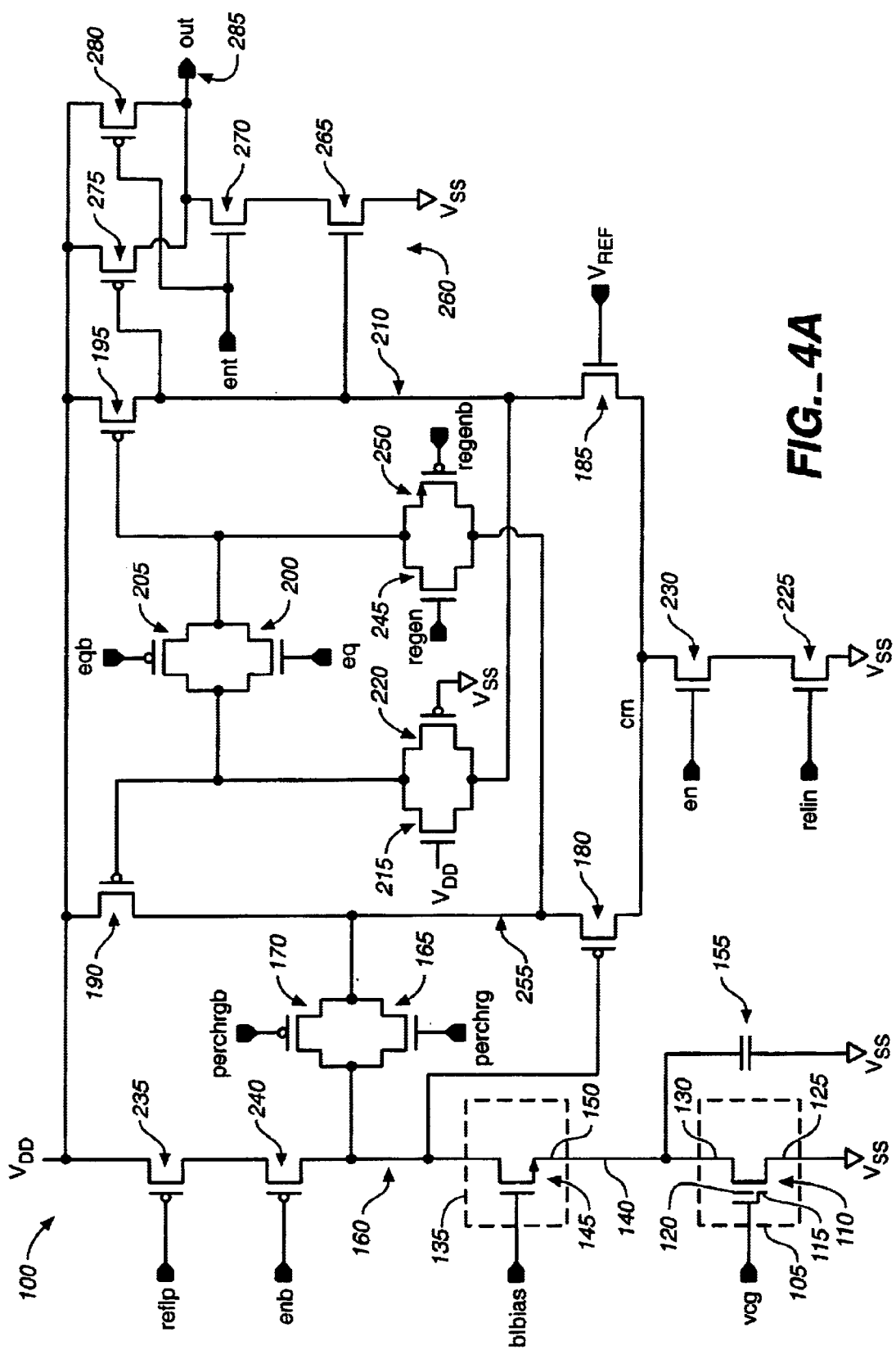
FIG._4A

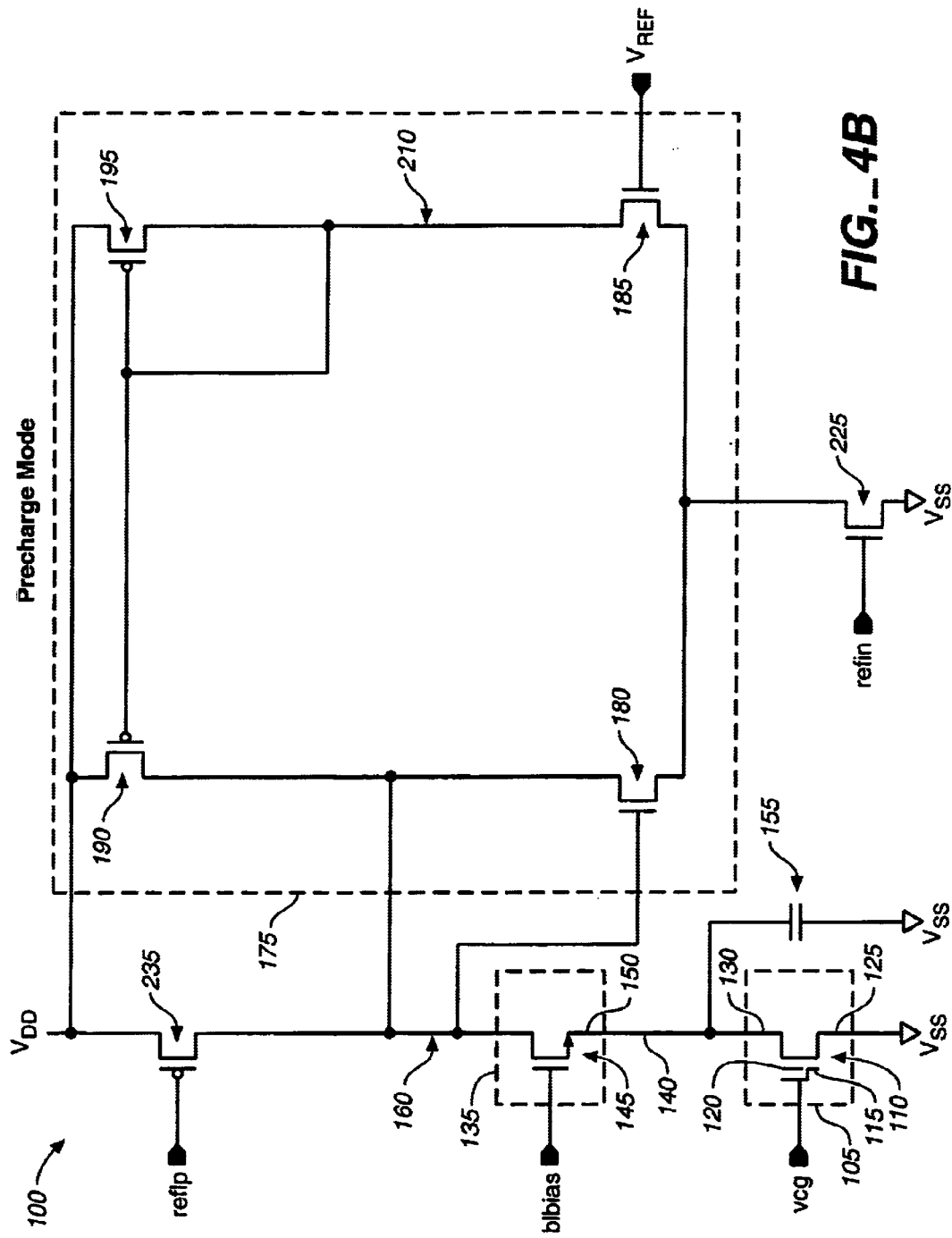
FIG._4B

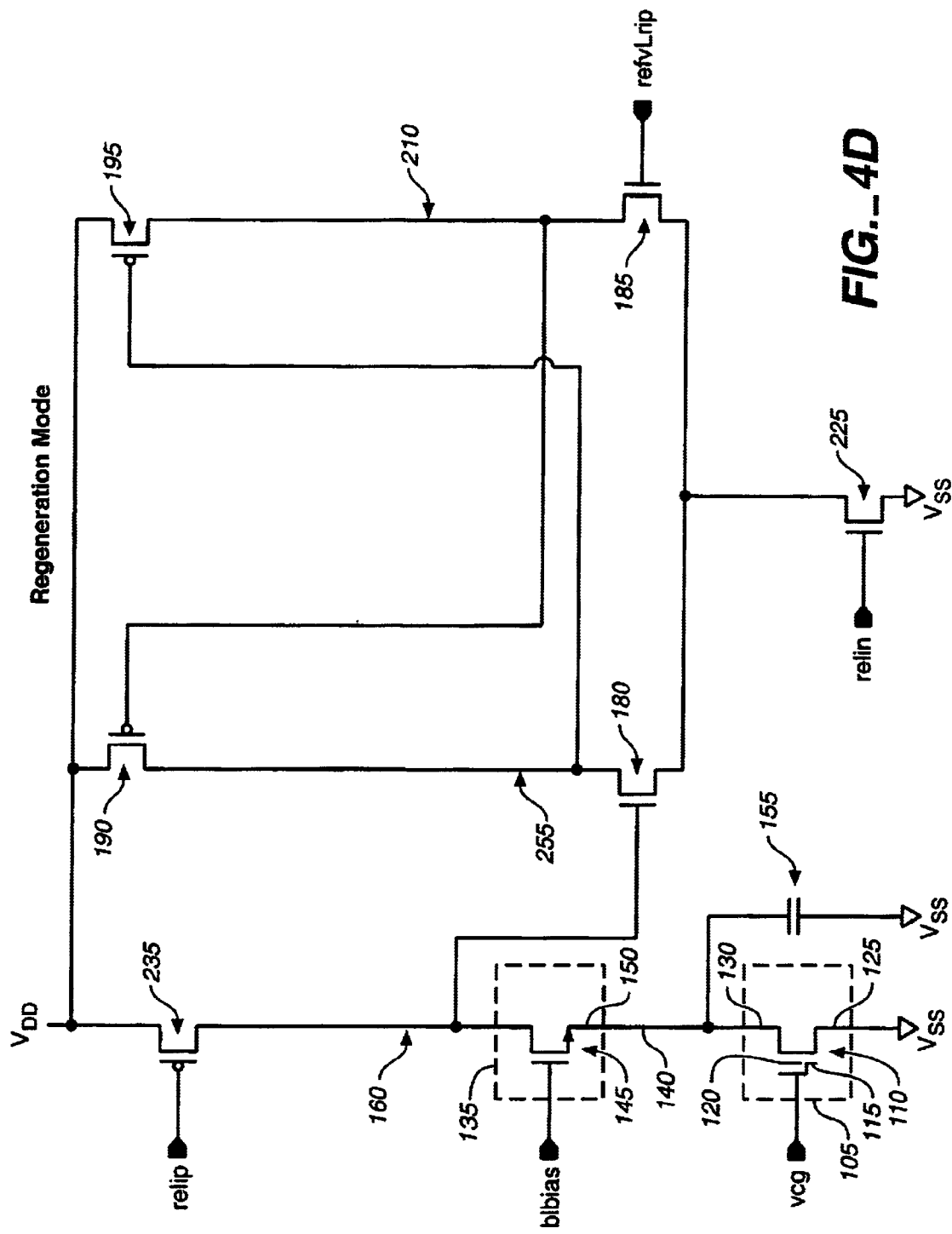
FIG._4D

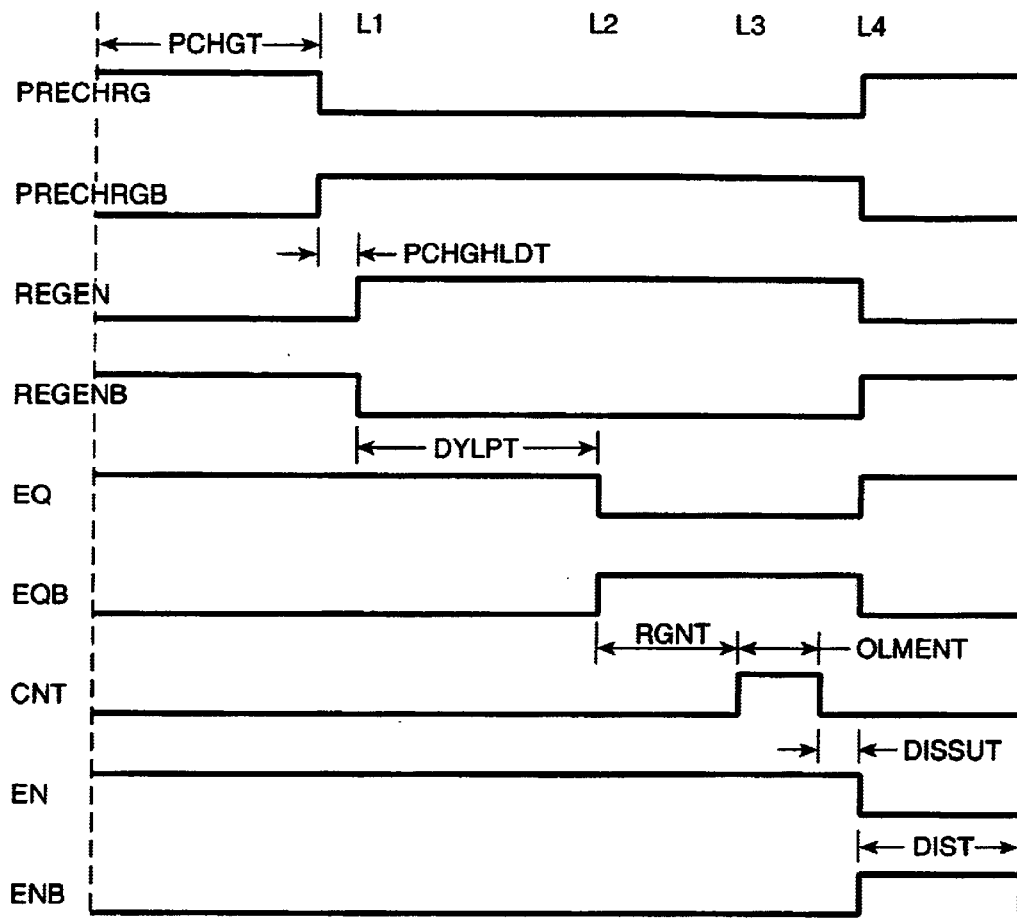
FIG._5
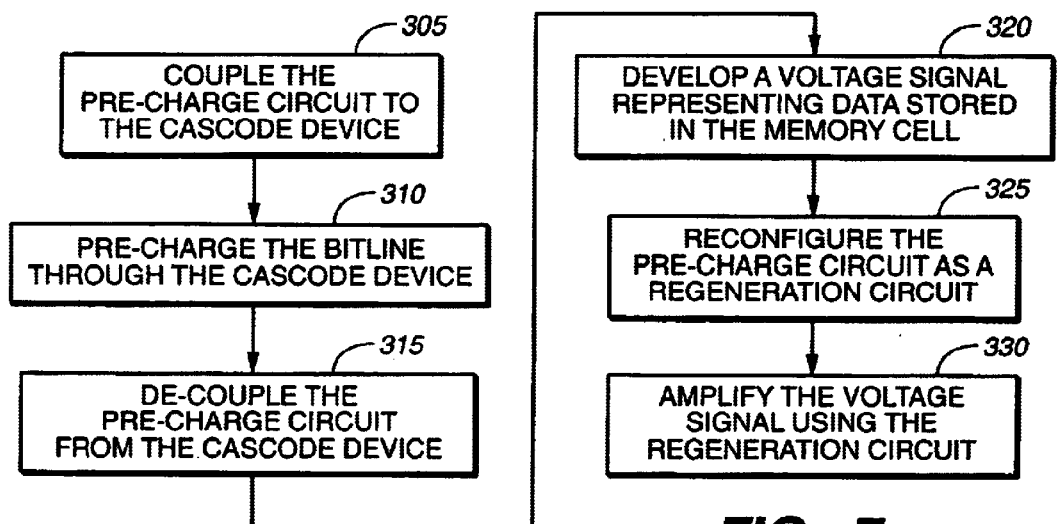
FIG._7

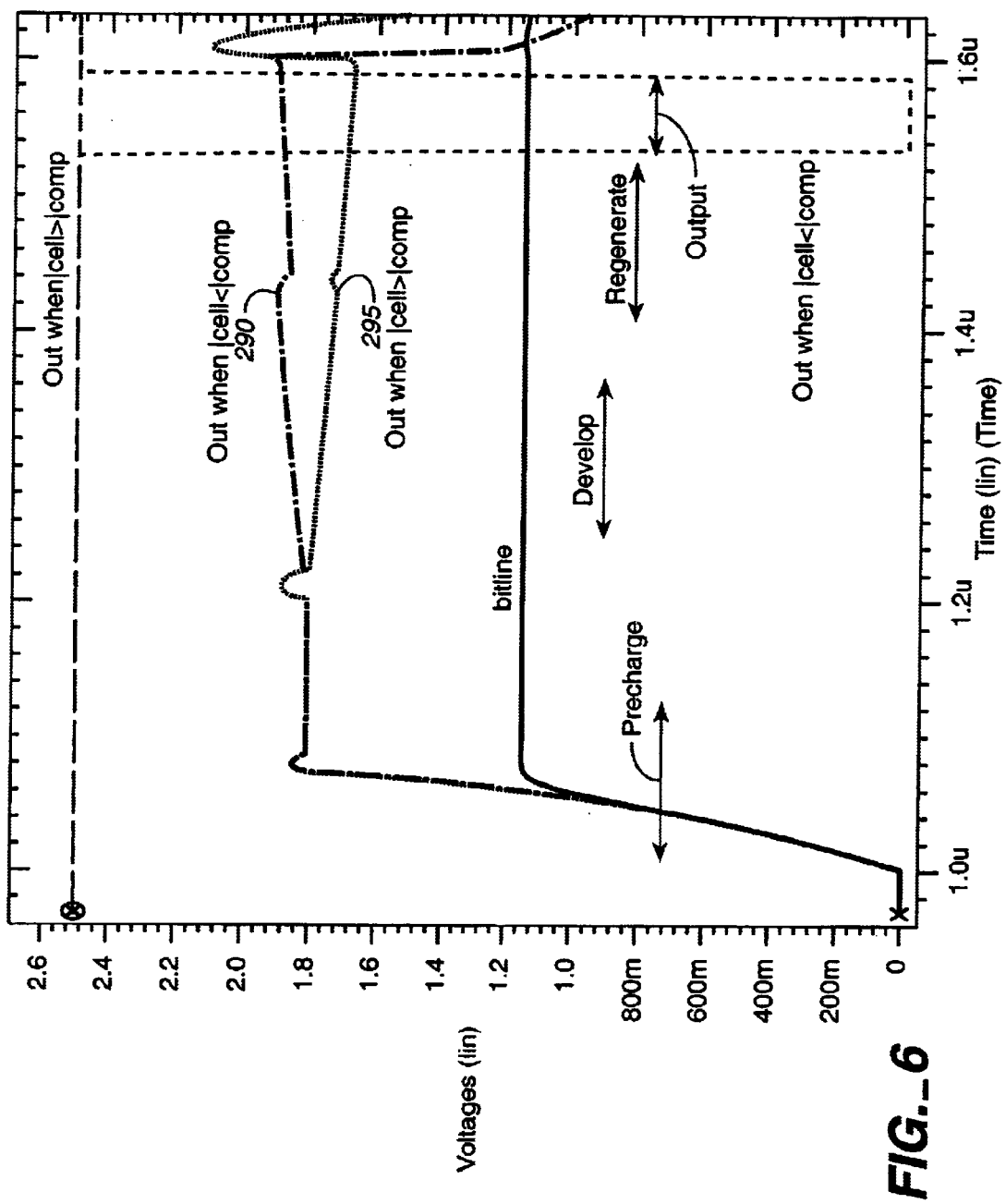
FIG._6

SENSE AMPLIFIER FOR MULTILEVEL NON-VOLATILE INTEGRATED MEMORY DEVICES

FIELD OF THE INVENTION

The present invention relates generally to non-volatile integrated memory devices and more particularly to an improved sense amplifier and method of operating the same to quickly read data stored in a multi-state memory cell with a high degree of accuracy.

BACKGROUND OF THE INVENTION

Non-volatile memories, such as electronically erasable programable read-only memories (EEPROM) or flash memories, are widely used in portable devices including devices lacking a mass data storage devices and a fixed source of power, such as cellular phones, handheld personal computers (PCs), portable music players and digital cameras.

Non-volatile memories are typically semiconductor devices having a number of memory cells each with a field effect transistor having a control-gate and an isolated or floating-gate that is electrically isolated from a source and a drain of the FET. Non-volatile memories program or store information by injecting charge on the floating gate to change a threshold voltage of the FET. The injected charge changes the threshold voltage of the FET from an intrinsic threshold voltage by an amount proportional to the charge. The new threshold voltage of the FET in the memory cell represents one or more bits of programmed data or information. For example, in a simple memory cell storing a single bit of data, the FET threshold voltage is either raised to a value near a high end of the threshold voltage range or maintained at a value near a low end. These two programmed threshold voltages represent a logical one or a logical zero. These voltages program the memory cell to turn on or off, respectively, when read conditions are established, thereby enabling a read operation to determine if data stored in the memory cell is a logical one or a logical zero.

To read the bit stored in a simple memory cell, an intermediate threshold voltage is applied to the FET and a resulting current compared with a reference current. A memory cell programmed to a high threshold voltage, a logical one, will conduct less current than the reference current, and a memory cell programmed to a low threshold voltage, a logical zero, will conduct more current than the reference current. The current comparison is accomplished with a circuit known as a sense amplifier or, more commonly, a sense amp. For a simple memory cell, the output of the sense amplifier is a one bit digital signal representing the logical state of the data stored in the memory cell.

More sophisticated non-volatile memories have multi-level or multi-state memory cells enabling the storage of more than one bit per memory cell. Storing more than one bit per memory cell requires that the threshold voltage space of the memory cell be divided or partitioned into multiple regions or memory states, each associated with one of several threshold voltages representing one of several possible bits or data states. For example, a multi-state memory cell capable of storing two bits of data requires a threshold space having four memory states, and a multi-state memory cell storing three bits of data requires partitioning the threshold space into eight memory states. Exemplary flash memories having such multi-state memory cells are described in U.S. Pat. Nos. 5,043,940 and 5,434,825, which patents are incorporated herein by reference.

To exploit the concept of non-volatile memories having multi-state memory cells fully, the memory states should be packed as closely together as possible, with minimal threshold voltage separation for margin/discrimination overhead. Thus, reading a multi-state memory cell requires that the sense amplifier precisely resolve the programmed threshold voltage with margins much smaller than the separation between available memory states. For example, given a multi-state memory cell having FETs with a two-volt threshold voltage space and four bits per memory cell (sixteen memory states per memory cell), each memory state is 125 mV wide, which requires the sense amplifier to resolve threshold voltages to within a few millivolts. Typically, the sense amplifier must be able to resolve thresholds to within about 10 mV or less.

In addition to resolving small voltage differences, performance requirements dictate that the sense amplifier be able to determine the programed threshold voltage within a very short time. This can be very critical in non-volatile memories using a closed loop write, where the programming operation is followed by a verify operation, in which the sense amplifier checks whether the threshold voltage of the memory cell being programmed has reached the desired value. These performance and resolution requirements are difficult to satisfy simultaneously. Often, performance must be sacrificed to improve resolution and vice versa.

FIG. 1 shows a prior art sensing circuit, commonly known as a current sensing circuit. A current mirroring circuit 10 and multiple sense amplifiers 15, generally one sense amplifier for each memory state, compare the current from memory cell 20 with multiple reference currents provided simultaneously by multiple reference current circuits 25. A predetermined fixed voltage, higher than a maximum programmed threshold voltage, is applied to the control gate of the memory cell being read. The resultant memory cell current is mirrored using a P-channel FET to multiple P-channel FETs as shown in FIG. 1. These multiple mirrored currents are compared to multiple reference currents by the multiple sense amps. The different reference currents are equal to current produced by programmed threshold voltages that correspond to boundaries of threshold voltage partitions. The digital outputs of the sense amps indicate the memory cell state.

While an improvement over earlier designs, this approach is not wholly satisfactory for a number of reasons. As arrays grow in size and have increasing numbers of memory cells, it is not feasible to provide the necessary current, generally on the order of tens of micro amperes ($\mu$A), to mirror for the larger number of cells. Furthermore, it is difficult to read the cell state by distinguishing small current levels.

In a so-called voltage sensing approach, shown in FIGS. 2 and 3, a voltage ($V_{BL}$) on a bit-line 28 of the memory cell 20 is pre-charged to a reference voltage ($V_{PRE}$) using a pre-charge voltage $V_{PRE}$. Optionally, bit-line 28 of the memory cell 20 is pre-charged through a cascode device 32. A control gate voltage ($V_{CG}$) exceeding the maximum possible threshold voltage ($V_T$) cell is applied to the control gate 28. $V_{CG}$ is chosen in relation to $V_T$ such that an erased memory cell will always conduct with that magnitude of $V_{CG}$. After a period of time, $\Delta t$, $V_{BL}$ is compared with a trip or reference voltage ($V_{TRP}$) using an inverter or comparator 30. Referring to FIG. 3, it is seen that if $V_{BL}$ is larger than $V_{TRP}$ after $\Delta t$, the cell 20 conducts less than an effective comparison current ($I_{COMP}$), and therefore $V_T$ is higher and the cell is programmed. It can be shown that a simplified approximate expression for the effective comparison current is:

$$I_{COMP}=C_{BL}(V_{PRE}-V_{TRP})/(A_v \cdot \Delta t)$$

where AV is the voltage gain of the cascode device, and $C_{BL}$ is the bit-line capacitance.

If the memory cell 20 is a multilevel or multi-state memory cell, the $V_T$ can be determined more precisely by applying a sequence of different $V_{CG}$ voltages and comparing the resultant $V_{BL}$ voltages. For example, in one version of this approach known as half-stepping, a $V_{CG}$ of about half of a maximum possible $V_{CG}$ is applied. If the resultant $V_{BL}$ is less than $V_{TRP}$, in a second iteration (or pass), a $V_{CG}$ that is half of the $V_{CG}$ applied in the first pass, or one-quarter of the maximum possible $V_{CG}$ is applied. If the resultant $V_{BL}$ is greater than expected, in the second or subsequent pass, a $V_{CG}$ that is 1.5·$V_{CG}$ applied in the first pass, or 75% of the maximum possible $V_{CG}$ is applied. The process continues until the $V_T$ is determined with sufficient precision.

While an improvement over earlier designs and methods for large arrays and/or small devices, this approach is not wholly satisfactory. For example, the effective comparison current is generally not constant due to variation in supply voltage, develop time (the time in which the intermediate threshold voltage is developed), or time variations in bit-line capacitance, as $I_{COMP}$ varies with time per the above equation. For example, bit-line capacitance can change from the write time to the read time of the cell due to write or erase of other memory cells in a memory array coupled to the same bit-line. This change in capacitance can cause an offset in $I_{COMP}$, resulting in multi-state memory cell data being read incorrectly.

Another problem is that the difference between $V_{PRE}$ and $V_{TRP}$ can vary with temperature and with the voltage supply, especially when the comparator is a simple inverter. Further, measured time can vary due to variations in a clock chip (not shown), which is susceptible to variations in temperature and/or supply voltages.

A further constraint on designs of non-volatile memories having multi-state memory cells is power consumed by the sense amplifier during the read operation. Non-volatile memories using the approach described above often require hundreds of sense amplifiers working in parallel to read the multi-state memory cells with sufficient precision and speed. Such large numbers of sense amplifiers can consume a significant portion of the available power. Thus, the very low power budgets of today's portable devices can put a severe constraint on sense amplifier design. For example, sense amps having cascode stages are desired for their increased gain. But cascode stages may not be practical because of an increased headroom required between voltage supply traces or head rails delivering high voltages from an external source. Non-volatile memories having high voltages from an on-chip voltage supply are available. However, these voltage supplies generally have a severely limited power capacity and consume too much power, especially in portable devices. Furthermore, the power available from on-chip voltage supplies is even more limited and must be conserved, especially to reduce chip heat dissipation. Thus, the shrinking power and voltage supplies in portable devices introduce limitations on sense amplifier designs.

Another important consideration in the design of sense amps is the chip or die area used by the sense amplifier. As noted above, to achieve satisfactory performance, a non-volatile memory having multi-state memory cells typically requires multiple sense amps on the chip. Thus, sense amplifiers can make up a significant fraction of the die area of the non-volatile memory.

Accordingly, there is a need for a non-volatile memory having multi-state memory cells with a sense amplifier capable of quickly reading data stored in the cell with a high degree of accuracy. There is a further need for a sense amplifier capable of reducing errors in reads due to due to low resolution. There is a still further need for a sense amplifier having a reduced power consumption, that makes efficient use of components to reduce cost and conserves chip space.

The present invention provides such sense amplifiers.

SUMMARY OF THE INVENTION

The present invention provides a sense amplifier with a pre-charged state set at the sense amplifier trip point. Use of such pre-charged trip point state provides an effective comparison current that is equal to a reference current, and substantially independent of variations in supply voltage, develop time, and capacitance of components of the sense amplifier, and advantageously reduces the time required for the sensing operation. In one embodiment, a pre-charge regenerative circuit is provided for the sense amplifier.

In one aspect, the present invention is directed to a sense amplifier for reading data stored in a multi-state memory cell in a non-volatile memory device. The sense amplifier includes a cascode device coupled to the drain of the memory cell FET and having a pre-charge circuit coupled to the cascode device. The cascode device is preferably a FET having a source coupled to the drain of the memory cell FET and having a drain coupled to the pre-charge circuit. The cascode device increases the resolution of the sense amplifier during a read operation, and isolates other components of the sense amplifier from a high voltage applied to the memory cell during a write operation. The pre-charge circuit is configured to pre-charge a node of the cascode device. The cascode device pre-charges the bit-line coupled to the memory cell to a pre-charge state during a pre-charge operation when the sense amplifier is in a pre-charge mode. Such pre-charging advantageously reduces time required to read the multi-state memory cell.

In another aspect, the pre-charge circuit includes a unity gain buffer to whose input a predetermined reference voltage is applied, and includes an output coupled to the node of the cascode device. The pre-charge circuit provides a bias current ($I_{BIAS}$) to the cascode device to pre-charge the bit-line through the cascode device to the predetermined reference voltage. The pre-charge circuit can further include a transistor switch to couple the unity gain buffer to the cascode device when the sense amplifier is in the pre-charge mode, and to decouple it from the cascode device when the sense amplifier is in a develop mode. In develop mode, a reference current circuit provides a reference current ($I_{REF}$) to the cascode device, and a difference between $I_{REF}$ and a current through the memory cell ($I_{CELL}$) causes a change in the voltage applied to the cascode device from the predetermined reference voltage, thereby developing a voltage signal representing data stored in the memory cell.

In yet another aspect, the pre-charge circuit is re-configured as a regeneration circuit when the sense amplifier is in a regeneration mode to amplify the voltage signal developed during the develop mode. The pre-charged state is selected to put the regeneration circuit into a meta-stable state set at a trip point of the sense amplifier. Use of such a pre-charged state at the trip point produces an effective comparison current that is equal to a reference current, and substantially independent from factors such as bit-line capacitance, supply voltage, and develop time. Such setting of the pre-charge state at the trip point of the sense amplifier can speed up the read operation.

In still another aspect, a method of operating a sense amplifier according to the present invention to read data stored in a multi-state memory cell is provided. A pre-charge circuit is coupled to the cascode device, and the bit-line pre-charged through the cascode device to a predetermined reference voltage. The pre-charge circuit is de-coupled from the cascode device, and a voltage signal representing data stored in the memory cell is developed. The pre-charge circuit is reconfigured as a regeneration circuit to amplify the voltage signal.

The pre-charge circuit preferably includes a unity gain buffer having an output coupled to the cascode device through a transistor switch. Coupling the pre-charge circuit to the cascode device is accomplished by applying a control signal to turn-on the transistor switch. Pre-charging the bit-line through the cascode device to the predetermined reference voltage involves (i) applying the predetermined reference voltage to an input of the unity gain buffer; and (ii) applying a bias current $I_{BIAS}$ from the unity gain buffer to a node of the cascode device to pre-charge the bit-line to the predetermined reference voltage. The sense amplifier further includes a reference current circuit to provide a reference current ($I_{REF}$) to the cascode device. The cascode device is pre-charged by applying both $I_{REF}$ and $I_{BIAS}$ simultaneously to the cascode device. Developing a voltage signal is accomplished by allowing a difference between $I_{REF}$ and a current through the memory cell ($I_{CELL}$) to change the predetermined reference voltage to which the bit-line is charged.

Reconfiguring the pre-charge circuit as a regeneration circuit involves forming an amplifier having a positive feedback loop. The voltage signal is then amplified using the amplifier. To further reduce time required to read the multi-state memory cell the pre-charge is preferably reconfigured to form the regeneration circuit while the voltage signal is being developed.

DESCRIPTION OF THE DRAWINGS

These and various other features and advantages of the present invention will be apparent upon reading of the following detailed description in conjunction with the accompanying drawings, where:

FIG. 1 is a schematic diagram of a read circuit for a non-volatile memory having multi-state memory cells comprising a current mirroring circuit and multiple sense amps, according to the prior art;

FIG. 2 is a schematic diagram of another read circuit for a non-volatile memory having multi-state memory cells comprising a pre-charge circuit and voltage comparator, according to the prior art;

FIG. 3 is a graph of voltage comparator output over time for the read circuit of FIG. 2, according to the prior art;

FIG. 4A is a schematic diagram of a sense amplifier according to an embodiment of the present invention;

FIG. 4B is a simplified schematic diagram of the sense amplifier of FIG. 4A configured in a pre-charge mode according to an embodiment of the present invention;

FIG. 4D is a simplified schematic diagram of the sense amplifier of FIG. 4A configured in a regeneration mode according to an embodiment of the present invention;

FIG. 5 is a timing diagram showing timing of control signals applied to components of the sense amplifier to configure the sense amplifier for different modes of operation according to an embodiment of the present invention;

FIG. 6 is a graph showing voltage waveforms from a sense amplifier according to an embodiment of the present invention; and FIG. 7 is a flowchart of a method for operating a sense amplifier according to the embodiment of the present invention.

DETAILED DESCRIPTION OF THE PREFERRED EMBODIMENT

Figure 4C:
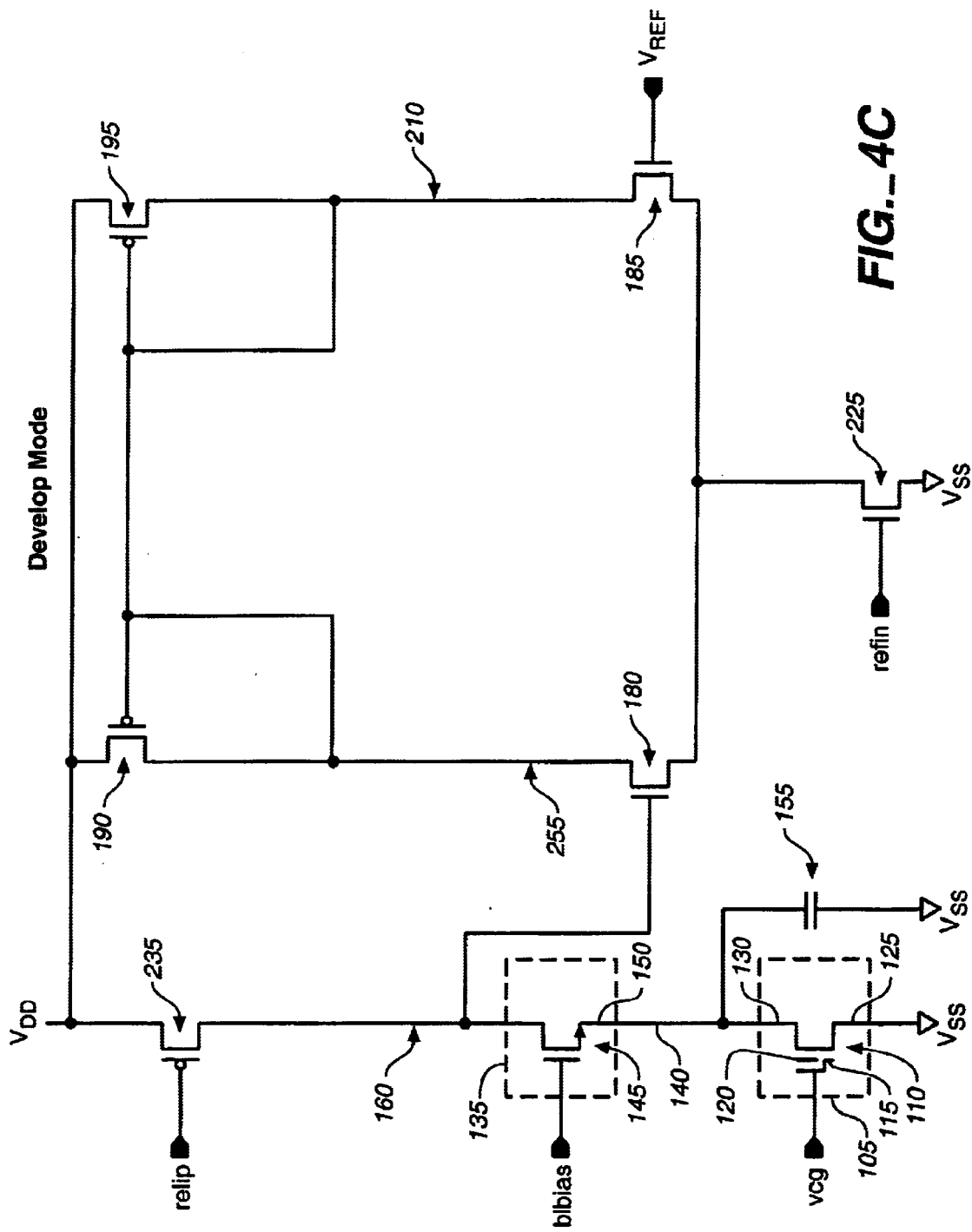
FIG. 4C is a simplified schematic diagram of the sense amplifier of FIG. 4A configured in a develop mode according to an embodiment of the present invention.

The present invention provides a sense amplifier for use in memories having multi-level memory cells that provides improved resolution and read times, and efficient use of components to reduce cost, immunity from process variation and to conserve chip space. A sense amplifier used according to the present invention is particularly useful for use with multi-level or multi-state memory cells capable of storing multiple bits of data. For example, a multi-state memory cell capable of storing four bits of data and having a single FET with a two-volt threshold voltage space requires sixteen separate memory states (not shown), each 125 mV wide. Thus, a sense amplifier used to read such a multi-state memory cell would require a high resolution to distinguish between the different memory states. Sense amplifier and the method of the present invention provide a resolution of at least about ±5 mV.

The sense amplifier will now be described with reference to FIGS. 4A to 4D. FIG. 4A shows an overall schematic diagram of an exemplary embodiment of a sense amplifier 100 for reading data stored in a memory cell or cell 105 according to the present invention.

Referring to FIG. 4A, memory cell 105 includes a field effect transistor (FET 110) having control-gate 115 and an isolated or floating-gate 120 that is electrically isolated from source 125 and drain 130 of the FET. Information or data is programmed or stored by injecting charge on the floating gate 120 to change the threshold voltage of the FET 110 from an intrinsic threshold voltage by an amount proportional to the charge. The programmed threshold voltage of FET 110 represents one or more bits of programmed data.

To read data stored in cell 105, a predetermined reference voltage ($V_{REF}$) is applied to drain 130 of FET 110. A resulting current, sunk by the cell, is compared to a reference current to determine the programmed threshold voltage of the cell, and thereby the state of data stored in the cell.

Sense amplifier 100 comprises a number of transistors that provide reference voltages and currents to cell 105, amplify a voltage signal that represents the programmed threshold voltage of the cell, and switch the coupling of some transistors to reconfigure the sense amplifier between different modes for completing different phases or cycles of operation.

Referring again to FIG. 4A, sense amplifier 105 includes cascode device 135 coupled to drain 130 of FET 110 of cell 105. Cascode device 135 increases resolution of sense amplifier 100, and isolates the remaining sense amplifier components from high-voltage developed on bit-line 140 during a write operation. In the embodiment shown, cascode device 135 is an FET 145 having source 150 coupled through bit-line 140 to drain 130 of the FET 110 of the memory cell 105 and to parasitic capacitance on the bit-line. This capacitance is represented by bit-line capacitor 155 connected in parallel with cell 105 to a source voltage $V_{ss}$.

The drain of FET 145 of cascode device 135 is coupled through a first output node 160 to transistors 165, 170. These transistors 165, 170, are switched on to couple the cascode device to unity gain buffer 175 (not labeled in this figure) formed by a pair of differential transistors 180, 185, and transistors 190, 195, when sense amplifier 100 is operated in a pre-charge mode. In the pre-charge mode, drain 130 of cell 105 and node 160 of the cascode device 135 are pre-charged to the predetermined reference voltage in preparation for reading the cell. The predetermined reference voltage is applied to a gate of transistor 185, and a gate of transistor 180 is coupled to node 160 to form a simple feedback circuit. Gates of transistors 190, 195, are coupled to one another through transistors 200, 205 and to a second output node (node 210) through transistors 215, 220. Transistor 225 is coupled to VSS to provide bias current ($I_{BIAS}$) to unity gain buffer 175 through transistor 230.

Transistor 235, coupled to drain voltage $V_{DD}$, provides reference current ($I_{REF}$) to node 160 through transistor 240, to which current through cell 105 is compared. In the pre-charge mode, $I_{REF}$ and $I_{BIAS}$ are provided to node 160 to pre-charge the cell 105 to the predetermined reference voltage. Generally, $I_{REF}$ is on the order of a few μA, less than half of $I_{BIAS}$. Thus, sense amplifier 100 enables cell 105 to be pre-charged much more rapidly than does a conventional sense amplifier, which relies on a small pre-charge current namely $I_{REF}$.

In a develop mode, a voltage ($V_{OUT1}$) is allowed to develop on node 160. In this mode transistors 245, 250, couple the gate of transistor 195 to a third output node (node 255). At the same time, transistors 215, 220, couple the gate of transistor 190 to node 210, and transistors 200, 205 couple the gates of transistors 190, 195, to one another.

Transistors 245, 250, also couple the gate of transistor 195 to node 255 in a regeneration mode, in which $V_{OUT1}$ is compared to $V_{REF}$ to determine difference voltage ($V_{DIFF}$) representing data stored in cell 105. In the regeneration mode, gates of transistors 190, 195, are coupled to node 210 and node 255 respectively to form a positive feedback loop. This configuration enables transistors 190, 195, to amplify $V_{DIFF}$, thereby increasing resolution of sense amplifier 100. Using the same transistors 180, 185, and 190, 195, in both the pre-charge and the regeneration modes, advantageously cancels-out any offsets in transistor gain due to process variations further improving the performance of sense amplifier 100. During different sense amplifier modes of operation node 210 and node 255 go through intermediate voltages, signals taken from these nodes cannot be used directly in digital logic circuits. Therefore, final stage 260, comprising transistors 265, 270, 275 and 280, use control signal (cnt) applied to transistor 270 to pass the signals to output 285 only at the end of a regeneration step.

Operation of sense amplifier 100 in different modes of operation will now be described in more detail with reference to FIGS. 4B–4D, FIG. 5 and FIG. 6. FIGS. 4B, 4C and 4D are simplified diagrams of the diagram of FIG. 4A showing sense amplifier 100 configured for pre-charge mode, develop mode, and regeneration mode respectively. FIG. 5 is a timing diagram showing timing of control signals applied to components of sense amplifier 100 to configure it for different modes of operation. FIG. 6 is a graph showing voltage waveforms from bit-line 140 and node 160 of sense amplifier 100 in different modes of operation.

Before the sensing operation begins, voltages refip, refin, vcg and vref are established using reference circuits (not shown) and current mirrors (not shown). Voltage refip determines the effective comparison current, $I_{COMP}$, and voltage refip establishes the bias current Ibias for the sense amplifier 100. Voltage vcg is applied to control-gate 115 to determine whether cell 105 threshold voltage is above or below vcg. Reference voltage blbias, is applied to the gate of the cascode device 135 to determine the voltage to which the bit-line 140 is charged during pre-charge mode. Voltage vref is a reference voltage to which bit-line 140 and node 160 of the cascode device 135 is charged, and is typically chosen to be a predetermined value approximately halfway between the supply voltage and ground.

FIG. 4B shows sense amplifier 100 configured in the pre-charge mode. Referring to FIG. 4B and FIG. 5, at time t0 enable signals en and enb are applied to transistors 230 and 240 (shown in FIG. 4A) to enable sense amplifier 100. Control signals eq and eqb are applied to transistors 200, 205, to form unity gain buffer 175. Control signals prechrg and prechrgb are applied to transistors 165, 170, to couple unity gain buffer 175 to node 160 to pre-charge node 160 of cascode device 135 and bit-line 140 of cell 105. $V_{REF}$ is applied to transistor 185, the input of unity gain buffer 175, and cascode device 135 and drain 130 of cell 105 are pre-charged to the predetermined reference voltage. Note that if current through cell 105 ($I_{CELL}$) is greater than $I_{REF}+I_{BIAS}$, then it will not be possible to charge cascode device 135 and drain 130 of the cell to $V_{REF}$. However, this will not affect operation of sense amplifier 100, whose output will still indicate that cell 105 is conducting more current than IREF in the develop mode.

FIG. 4C shows sense amplifier 100 configured in the develop mode. Referring to FIG. 4C and FIG. 5, after the pre-charge operation is complete, at time t1 control signals prechrg and prechrgb are removed from transistors 165, 170, (shown in FIG. 4A). This disconnects unity gain buffer 175 (shown in FIG. 4B) from node 160, and allows $V_{OUT1}$ to develop on node 160. Transistors 165 and 170 are preferably sized to minimize charge injection into node 160 at the beginning of the develop cycle when transistors 165 and 170 turnoff. Minimizing charge injection is desired to improve the performance of the sense amplifier 100. If significant charge is injected to node 160, the node voltage can change, and the develop cycle must be made larger to recover from such injected charge. The voltage on node 160 will drop from the pre-charged value, $V_{REF}$ if $I_{CELL}$ is greater than $I_{REF}$, and will increase if $I_{CELL}$ is smaller than $I_{REF}$. The change in $V_{OUT1}$ is improved by cascode device 135, because bit-line 140 capacitance (which is much bigger than the capacitance at node 160) needs to move by a small fraction of the $V_{OUT1}$ change. While $V_{OUT1}$ is being developed, differential transistors 180, 185, are prepared for the next step, a regeneration operation, by shorting nodes 210 and 255, and connecting transistors 190, 195, as a diode connected load. FIG. 5 shows the control signals eq, eqb, regen and regenb applied to transistors 200, 205, 215, 245 and 250 respectively to accomplish this step.

FIG. 4D shows sense amplifier 100 configured in the regeneration mode. Referring to FIG. 4D and FIG. 5, after the develop operation is complete, at time t2 control signals eq and eqb are removed from transistors 200, 205, (shown in FIG. 4A) respectively decoupling the gates of transistors 190, 195. If the difference between $I_{CELL}$ and $I_{REF}$ is small, $V_{OUT1}$ will move by a very small amount in the develop operation. FIG.6 show how this is amplified in the regeneration operation. Referring to FIG. 6, line 290 indicates $V_{OUT1}$ when $I_{CELL}$ is less than $I_{REF}$, and line 295 indicates $V_{OUT1}$ when $I_{CELL}$ is greater than $I_{REF}$. This small difference between $V_{OUT1}$ and $V_{REF}$ ($V_{DIFF}$) is amplified in the regeneration mode by transistors 190, 195. As noted above, these transistors 190, 195, are configured to form an amplifier having a positive feedback loop to enable amplification of the change in $V_{OUT1}$ from $V_{REF}$, mode. At the end of the regeneration operation, nodes 210 and 255 have digital levels indicating the result of comparison. At time t3 control signal cnt is applied to transistor 270 to pass the signals on nodes 210 and 255 to output 285.

At time t4 control signals eq, eqb, prechrg and prechrgb are applied to transistors 200, 205, 165 and 170, respectively, to reconfigure sense amplifier 100 for the next pre-charge operation. Control signals regen, regenb and cnt are removed from transistors 245, 250 and 270 respectively. Enabling control signals en and enb are removed from transistors 230 and 240 respectively until the pre-charge operation is ready to begin.

A method or process of operating the sense amplifier 100 to read a memory having multi-level memory cells will now be described. FIG. 7 is a flowchart showing a process for operating the sense amplifier 100 according to an embodiment of the present invention. The process begins by coupling the pre-charge circuit to the bit-line 140 through node 160 of cascode device 135 at step 305. Generally, this is accomplished by applying a control signal to the transistor switch to cause it to turn on. Next, at step 310, the cascode device is pre-charged to a predetermined reference voltage. The predetermined reference voltage is applied to the input of the unity gain buffer to generate a bias current ($I_{BIAS}$), and the $I_{BIAS}$ and a reference current ($I_{REF}$) from the reference current circuit are applied to the cascode device to pre-charge the cascode device to the predetermined reference voltage. The pre-charge circuit is de-coupled from the cascode device, step 315, and a voltage signal is developed representing data stored in the memory cell, at step 320. At step 320, the step of developing the voltage signal is developed by allowing a difference between $I_{REF}$ and a current through the memory cell ($I_{CELL}$) to change the voltage to which the cascode device is charged. At step 325, the pre-charge circuit is reconfigured as a regeneration circuit by changing the couplings between transistors in the pre-charge circuit to form an amplifier having a positive feedback loop. The voltage signal is then amplified using the regeneration circuit at step 330.

Preferably, sense amplifier 100, an array of memory cells (not shown), a high-voltage supply or pump (not shown) and a selector (not shown) for selecting the cell to couple the sense amplifier to are fabricated on the same substrate or chip. However, it will be understood that sense amplifier 100 of the present invention can also be fabricated as a separate integrated circuit or as a circuit of separate components without departing from the scope of the present invention.

It is to be understood that even though numerous characteristics and advantages of certain embodiments of the present invention have been set forth in the foregoing description, together with details of the structure and function of various embodiments of the invention, this disclosure is illustrative only. Changes may be made as to detail, especially in matters of structure and arrangement of parts within the principles of the present invention to the full extent indicated by the broad general meaning of the terms in which the appended claims are expressed. For example, although the preferred embodiment described herein is directed to memories using solid-state microelectronics, it will be appreciated by those skilled in the art that the teachings of the present invention can be adapted to other memories, for example those using molecular-scale organic or chemical switches. Thus, the scope of the appended claims is not to be limited to the preferred embodiments described herein.

What is claimed is:

1. A method of operating a sense amplifier to read data stored in a memory cell, the method comprising steps of:
   pre-charging a bit-line of the memory cell to a predetermined reference voltage substantially equal to a trip point of the sense amplifier using a pre-charge circuit;
   developing a voltage signal representing data stored in the memory cell;
   reconfiguring the pre-charge circuit as a regeneration circuit; and
   amplifying the voltage signal using the regeneration circuit such that the amplified voltage signal increasingly deviates from the predetermined reference voltage with increasing time.

2. A method according to claim 1, further including the step of pre-charging a node of a cascode device coupled to the bit-line of the memory cell.

3. A sense amplifier to read a multi-state memory cell having a field effect transistor (FET) with a source, a drain and a bit-line, the sense amplifier comprising:
   a device coupled to the drain of the FET of the memory cell, the device adapted to increase the resolution of the sense amplifier during a read mode and to isolate the sense amplifier from a high voltage applied to the memory cell during a write mode; and
   a pre-charge circuit coupled to the cascode device, the pre-charge circuit configured to pre-charge the bit-line of the memory cell through a cascode device during a pre-charge mode to reduce time required to read the multi-state memory cell,
   wherein the pre-charge circuit comprises a unity gain buffer having an input to which a predetermined reference voltage is applied, and an output coupled to provide a bias current($I_{BIAS}$) to the cascode device to pre-charge the bit-line by charging a node of the cascode device to the predetermined reference voltage.

4. A sense amplifier according to claim 3, wherein the pre-charge circuit further comprises a transistor switch to couple the unity gain buffer to the cascode device during the pre-charge mode and to de-couple the unity gain buffer from the cascode device during a develop mode.

5. A sense amplifier according to claim 4, further comprising a reference current circuit to provide a reference current ($I_{REF}$), wherein in the develop mode a difference between $I_{REF}$ and a current through the memory cell ($I_{CELL}$) causes a change from the predetermined reference voltage to which the node of the cascode device is charged to develop a voltage signal representing data stored in the memory cell.

6. A sense amplifier according to claim 5, wherein the pre-charge circuit is re-configurable as a regeneration circuit during a regeneration mode to amplify the voltage signal developed during the develop mode.

7. In a memory having at least one multi-state memory cell capable of storing data therein and a sense amplifier capable of reading data stored in the memory cell, the sense amplifier having a cascode device coupled to the memory cell and a pre-charge circuit for pre-charging a bit-line of the memory cell through the cascode device, a method of operating the memory to read data stored in the multi-state memory cell, the method comprising the steps of:
   coupling the pre-charge circuit to the cascode device;
   pre-charging the bit-line of the memory cell through the cascode device to a predetermined reference voltage;
   de-coupling the pre-charge circuit from the cascode device;

developing a voltage signal representing data stored in the memory cell;

reconfiguring the pre-charge circuit as a regeneration circuit; and amplifying the voltage signal using the regeneration circuit such that the amplified voltage signal increasingly deviates from the predetermined reference voltage with increasing time.

8. A method according to claim 7, wherein the pre-charge circuit comprises a unity gain buffer having an output switchably coupled to the cascode device, and wherein the step of coupling the pre-charge circuit to the cascode device includes applying a control signal to couple the output to the cascode device.

9. A method according to claim 8, wherein the step of pre-charging the cascode device to a predetermined reference voltage includes:

applying the predetermined reference voltage to an input of the unity gain buffer; and applying a bias current ($I_{BIAS}$) from the unity gain buffer to the cascode device to pre-charge the bit-line of the memory cell by charging the node of the cascode device to the predetermined reference voltage.

10. A method according to claim 9, wherein the sense amplifier further comprises a reference current circuit to provide a reference current ($I_{REF}$) to the cascode device, and wherein the step of pre-charging the cascode device to a predetermined reference voltage includes applying $I_{REF}$ and $I_{BIAS}$ simultaneously to the cascode device to pre-charge the bit-line through the cascode device to the predetermined reference voltage.

11. A method according to claim 10, wherein the step of developing a voltage signal includes enabling a difference between $I_{REF}$ and a current through the memory cell ($I_{CELL}$) to cause a change from the predetermined reference voltage to which the cascode device is charged.

12. A method according to claim 7, wherein the step of reconfiguring the pre-charge circuit as a regeneration circuit includes forming an amplifier having a positive feedback loop.

13. A method according to claim 12, wherein the pre-charge circuit comprises a unity gain buffer, and wherein forming an amplifier includes forming the amplifier using components comprising the unity gain amplifier.

14. A method according to claim 12, wherein the step of amplifying the voltage signal includes amplifying the voltage signal using the amplifier.

15. A multi-state memory comprising:

at least one multi-state memory cell capable of storing data therein; a sense amplifier capable or reading data stored in the memory cell, the sense amplifier including:

a cascode device coupled to the memory cell;

a pre-charged circuit for pre-charging a bit-line of the at least one multi-state memory cell through the cascode device;

a developing circuit for developing a voltage signal representing data stored in the memory cell using a reference current; and an amplifying circuit for amplifying the voltage signal such that the amplified voltage signal increasingly deviates from the predetermined reference voltage with increasing time.

16. A multi-state memory comprising:

at least one multi-state memory cell capable of storing data therein; a sense amplifier capable or reading data stored in the memory cell, the sense amplifier including:

a cascode device coupled to the memory cell;

a pre-charged circuit for pre-charging a bit-line of the at least one multi-state memory cell through the cascode device;

a developing circuit for developing a voltage signal representing data stored in the memory cell using a reference current; and an amplifying circuit for amplifying the voltage signal, wherein the pre-charging circuit comprises a unity gain buffer having an input to which a predetermined reference voltage is applied, and an output coupled to provide a bias current ($I_{BIAS}$) to the cascode device to pre-charge the bit-line by charging the node of the cascode device to the predetermined reference voltage.

17. A multi-state memory according to claim 16, wherein the developing circuit comprises:

means for decoupling the output of the pre-charge circuit from the cascode device;

a reference current circuit to provide a reference current ($I_{REF}$) to the cascode device; and wherein a difference between $I_{REF}$ and a current through the memory cell ($I_{CELL}$) causes a change from the predetermined reference voltage to which the node of the cascode device is charged.

18. A multi-state memory according to claim 16, wherein the developing circuit for developing a voltage signal comprises a regeneration circuit having an amplifier with a positive feedback loop.

19. A multi-state memory according to claim 18, wherein the pre-charging circuit comprises components of the unity gain amplifier coupled together in a first configuration, and wherein the regeneration circuit comprises components of the unity gain amplifier coupled together in a second configuration.

* * * * *